United States Patent
Ohm

(10) Patent No.: US 10,075,230 B2
(45) Date of Patent: Sep. 11, 2018

(54) APPARATUS, ONBOARD EQUIPMENT, METHOD, AND COMPUTER PROGRAM FOR A REMOTE RADIO HEAD

(71) Applicant: Alcatel Lucent, Boulogne Billancourt (FR)

(72) Inventor: Michael Ohm, Stuttgart (DE)

(73) Assignee: Alcatel Lucent, Boulogne Billancourt (FR)

( * ) Notice: Subject to any disclaimer, the term of this patent is extended or adjusted under 35 U.S.C. 154(b) by 0 days.

(21) Appl. No.: 14/759,454

(22) PCT Filed: Dec. 5, 2013

(86) PCT No.: PCT/EP2013/075660
§ 371 (c)(1),
(2) Date: Jul. 7, 2015

(87) PCT Pub. No.: WO2014/108253
PCT Pub. Date: Jul. 17, 2014

(65) Prior Publication Data
US 2015/0358070 A1 Dec. 10, 2015

(30) Foreign Application Priority Data
Jan. 8, 2013 (EP) ..................................... 13305013

(51) Int. Cl.
| H04B 7/185 | (2006.01) |
| H04L 29/08 | (2006.01) |
| H04B 1/04 | (2006.01) |
| H04B 7/06 | (2006.01) |

(Continued)

(52) U.S. Cl.
CPC ........... *H04B 7/18506* (2013.01); *H03F 3/24* (2013.01); *H04B 1/0475* (2013.01); *H04B 7/0608* (2013.01); *H04B 7/0805* (2013.01); *H04L 67/12* (2013.01); *H04B 2001/0408* (2013.01)

(58) Field of Classification Search
CPC ........ H04B 7/18506; H04B 2001/0408; H04B 7/0608; H04B 7/0805; H04W 84/005; H04L 1/0001; H04N 21/2146; H04N 21/41422
See application file for complete search history.

(56) References Cited

U.S. PATENT DOCUMENTS

| 4,134,118 A | 1/1979 | Corbett |
| 7,146,147 B1 | 12/2006 | Sabatino |
| 8,145,208 B2 | 3/2012 | Chari et al. |

(Continued)

FOREIGN PATENT DOCUMENTS

| CN | 101536360 A | 9/2009 |
| CN | 101978771 A | 2/2011 |

(Continued)

OTHER PUBLICATIONS

International Search Report for PCT/EP2013/075660 dated Mar. 12, 2014.

*Primary Examiner* — Shukri Taha
(74) *Attorney, Agent, or Firm* — Fay Sharpe LLP

(57) ABSTRACT

Embodiments provide an apparatus, onboard equipment, a method, and a computer program for a remote radio head. The apparatus (10) for a remote radio head (100) comprises a switch (12) operable to substantially switch the transmit signal between the two or more transmit antennas (20).

15 Claims, 7 Drawing Sheets

(51) Int. Cl.
*H04B 7/08* (2006.01)
*H03F 3/24* (2006.01)

(56) References Cited

U.S. PATENT DOCUMENTS

| | | | |
|---|---|---|---|
| 8,204,544 | B2 | 6/2012 | Beaudin et al. |
| 8,428,580 | B1 * | 4/2013 | Mitchell ............ H04B 7/18506 455/13.4 |
| 8,605,654 | B2 | 12/2013 | Beaudin et al. |
| 8,817,917 | B2 * | 8/2014 | Kroeger ............... H04B 7/0805 375/267 |
| 2008/0102812 | A1 | 5/2008 | Chari et al. |
| 2009/0096857 | A1 * | 4/2009 | Frisco ................ H04B 7/18508 348/14.02 |
| 2011/0149887 | A1 | 6/2011 | Khandekar et al. |
| 2011/0302391 | A1 | 12/2011 | Copeland et al. |
| 2012/0202418 | A1 * | 8/2012 | Jalali .................... H01Q 1/2291 455/15 |
| 2012/0231788 | A1 * | 9/2012 | Kaminski .............. H01Q 1/246 455/431 |
| 2013/0182790 | A1 * | 7/2013 | Jalali ....................... H01Q 3/24 375/285 |

FOREIGN PATENT DOCUMENTS

| | | |
|---|---|---|
| CN | 102067716 A | 5/2011 |
| EP | 1063789 | 12/2000 |
| EP | 2 375 499 A1 | 10/2011 |
| JP | 2010-508772 A | 3/2010 |

\* cited by examiner

Switching ~32

Fig. 7

APPARATUS, ONBOARD EQUIPMENT, METHOD, AND COMPUTER PROGRAM FOR A REMOTE RADIO HEAD

Embodiments of the present invention relate to mobile communications, more particularly but not exclusively to communication networks for providing wireless services to airplanes.

BACKGROUND

Airlines are currently investigating solutions to provide broadband connectivity for their passengers. Candidates are for instance commercial systems as Long-Term Evolution (LTE), which has been standardized as the successor of the Universal Mobile Telecommunications System (UMTS). For the downlink transmission, i.e. the direction from a Base Station (BS), e.g. NodeB or eNodeB, to a mobile terminal or User Equipment (UE), LTE utilizes Orthogonal Frequency Division Multiple Access (OFDMA) as the physical layer technique which enables high data rate transmission, particularly in frequency selective fading scenarios. LTE as the technology basis for a terrestrial cellular Direct Air-to-Ground (DA2G) communication system is a favorable option for the airlines' continental fleets compared to satellite solutions due to the provision of higher bandwidth at lower cost. Similar considerations may apply for railway companies.

The LTE air interface is optimized for terrestrial cellular networks. In the terrestrial environment there is a lot of fading in mobile communication channels and propagation loss is often much heavier than free space loss due to the presence of buildings and other obstacles. In the direct air-to-ground scenario, wherein a terrestrial mobile communication network is used for communication between a mobile terminal located in an aircraft and a ground-located base station, some partial fading may still occur but it will be typically much less severe than the fading that a terrestrial User Equipment (UE) on the ground may encounter. Instead, the DA2G scenario is characterized by a wireless communication channel with a dominating Line-Of-Sight (LOS) component.

However, depending on the position of an antenna on the body of an airplane and a direction to an associated base station on the ground shadowing due to the body of the plane, its wings, etc. may occur. Therefore conventional systems use multiple antennas at different positions on the airplane in order to overcome potential shadowing.

SUMMARY

Embodiments are based on the finding that there is a desire to provide technical means for wireless communication between the inside of the aircraft and ground stations. Moreover, it is a finding that it may be desirable for the communication system or aircraft components thereof to have a low number of components in order to keep cost and weight for the equipment, installation and maintenance of the system low, but at the same time provide good performance of the wireless link to the ground.

It is a further finding that conventional systems may use two DA2G fuselage antennas in the aircraft belly, for example, one in front of the wings and one behind the wings. These antennas may avoid non-negligible shadowing of the wireless link by the wings or engines in various flight conditions or plane positions. With this arrangement of the antennas one of the DA2G fuselage antennas may always have an unobstructed line-of-sight propagation path to the ground base stations. Furthermore, shadowing could have a severe impact on the overall performance, as a shadowing situation could last for several minutes, and due to the large cells with radii up to 150 km additional loss could push received power levels both at the aircraft and at the ground base stations below required minimum levels.

It is a further finding that in such an aircraft application as few components as necessary should be used. Embodiments are therefore based on the finding that instead of using multiple radio frequency power stages, a single radio frequency power stage may be used together with a switch, for substantially switching between transmit antennas. Embodiments therefore provide an apparatus for a remote radio head. A remote radio head is a component that comprises typical high frequency or radio frequency components, such as a power amplifier, one or more filters, one or more connectors for transmit and/or receive antennas, oscillators, etc. A remote radio head as such may therefore provide high frequency or radio frequency components for processing radio signals. In other words, the apparatus is adapted to be used or comprised in a remote radio head. Further embodiments also provide a remote radio head comprising the apparatus for the remote radio head. The remote radio head is operable to communicate information with a central unit. The central unit is the unit which comprises baseband processing means, for example, in terms of one or more processors, one or more Digital Signal Processors (DSPs), Application-Specific Integrated Circuits (ASICs), etc. That is to say, the central unit may perform the signal processing that is not performed by the remote radio head. The remote radio head and the central unit together may form a mobile station transceiver, a base station transceiver or a relay station transceiver. For example, when being installed in an airplane the remote radio head and the central unit may appear as a base station transceiver from the perspective of a mobile transceiver inside the plane, which may also depend on the access technology used inside the airplane, e.g. they may appear as an access point. From a ground network's perspective the remote radio head and the central unit may appear as a mobile transceiver moving along with the airplane. From an overall perspective the remote radio head and the central unit may appear as a relay station relaying information between base station transceivers of the ground network and mobile transceivers inside the airplane. The remote radio head is operable to transmit a transmit signal to a base station transceiver of a mobile communication system using two or more transmit antennas.

The apparatus and the above components may hence be part of a mobile communication system. The mobile communication system may, for example, correspond to one of the mobile communication systems standardized by the $3^{rd}$ Generation Partnership Project (3GPP), as Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. In the following the terms mobile communication system and mobile communication network are used synonymously.

The mobile communication system may comprise a plurality of transmission points or base station transceivers operable to communicate radio signals with a mobile transceiver, which can be carried out indirectly through the remote radio head and the central unit. That is to say that the mobile transceiver may be located in a plane or train and may access the central unit, which in turn uses the remote radio head to communicate with a ground base station. In other words the central unit and the remote radio head may establish a relay station transceiver relaying signals or information between mobile transceivers inside, for example, an airplane or a train, and a mobile communication system. The term relay station transceiver shall indicate that information is relayed between mobile transceivers inside the airplane or train and base station transceivers outside of the airplane or train. In some embodiments the actual communication interfaces, e.g. the air interfaces, may differ when comparing the inside communication with the outside communication. For example, a DA2G modem may be implemented in the central unit, which may terminate an LTE protocol stack. Hence, in some embodiments LTE signals may not be received from inside the aircraft but any other technology may be used to communicate information inside the aircraft and said information may then be relayed to the ground using LTE compliant signals. The DA2G modem in the central unit may then receive Internet Protocol (IP) traffic and transmit this IP traffic over the LTE link. In embodiments, the mobile communication system may comprise mobile transceivers, relay station transceivers and base station transceivers. The relay station transceivers and base station transceivers can be composed of one or more central units and one or more remote units.

A mobile transceiver may correspond to a smartphone, a cell phone, User Equipment (UE), a laptop, a notebook, a personal computer, a Personal Digital Assistant (PDA), a Universal Serial Bus (USB)-stick, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a femto cell, a metro cell etc. A base station transceiver can be a wireless interface of a wired network, which enables transmission and reception of radio signals to a UE or mobile transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver, such as in the above-mentioned airplane- or train-scenario. A relay station transceiver may forward a signal received from a mobile transceiver to a base station transceiver, signals received from the base station transceiver to the mobile station transceiver, respectively.

The mobile communication system may thus be cellular. The term cell refers to a coverage area of radio services provided by a transmission point, a remote unit, a remote head, a remote radio head, a base station transceiver or a NodeB, an eNodeB, respectively. In some embodiments a cell may correspond to a sector. For example, sectors can be achieved using sector antennas, which provide a characteristic for covering an angular section around a base station transceiver or remote unit. In some embodiments, a base station transceiver or remote unit may, for example, operate three or six cells covering sectors of 120° (in case of three cells), 60° (in case of six cells) respectively. A mobile transceiver can be registered or associated with a cell, i.e. it can be associated to a cell such that data can be exchanged between the network and the mobile in the coverage area of the associated cell using a dedicated channel, link or connection.

In embodiments the remote radio head apparatus, i.e. the apparatus for the remote radio head, comprises a switch, which is operable to switch the transmit signal between the two or more transmit antennas. Embodiments may therewith provide the advantage that using the switch, one of the transmit antennas can be selected for transmission. At the same time, only a single power stage is necessary in order to generate the transmit signal. Compared to conventional concepts using two remote radio heads or remote units, one remote unit can be saved, while still being able to select at least one out of the two or more transmit antennas. Saving one power stage reduces costs, weight, and improves the overall efficiency of the system. In embodiments, the switch may correspond to any means for switching, such as a switching device, a switching unit, a switching module, etc. In embodiments, the switch may correspond to a high frequency or a radio frequency switch. In some embodiments, although the transmit signal is switched using the switch to one out of the two or more transmit antennas, there may be some signal parts measurable on any one of the other transmit antennas. These other signals may be due to cross-coupling, noise, imperfect switch, etc. From that perspective, the switch is operable to substantially switch the transmit signal between the two or more transmit antennas.

In further embodiments, the apparatus for the remote radio head further comprises a power amplifier for amplifying the transmit signal. As indicated above, since only one remote radio head may be necessary to serve at least two transmit antennas while still being able to switch between the transmit antennas, one power amplifier can be saved. The switch may then be operable to switch the amplified transmit signal between the two or more transmit antennas. In some embodiments, the switch can be operable to switch at least one of the at least two transmit antennas substantially off, where the term substantially shall indicate that the main power of the transmit signal is directed to one antenna, while no signal or only residual signals may be measurable at the other antenna, which can be due to the above-listed effects.

In further embodiments, the remote radio head and the central unit can be operable in an airplane and the base station transceiver may correspond to a ground base station transceiver. That is to say that the base station transceiver can be part of one of the above-listed communication systems, which is installed as a ground network with an according infrastructure. For example, such infrastructure may be cellular; however the cell sizes may be adapted to the respective application, i.e. to the direct air to ground communication. This installation may result in larger cell sizes than are common in conventional mobile communication systems for ground communication only. As it has already been mentioned above, cell radii of such cells may reach 150 km, 200 km or even more, in some embodiments such cell radii may lie between 50 and 200 km, for example 100 to 150 km.

The remote radio head and the central unit may then be installed in an airplane or train, where it can be still desirable to bring the remote radio head as close to the transmit antennas as possible. For example, the remote radio head may comprise coaxial cables and/or low attenuation cables, in order to couple an amplifier with the antennas, keeping cable losses as low as possible. Since weight balance requirements and other requirements in an aircraft demand that the central unit may be located further away from the remote unit, there may be an interconnection between the remote radio head and the central unit, for example using optical fibers, as will be detailed subsequently.

In further embodiments, the remote radio head apparatus may further comprise a controller which is operable to determine information related to a radio link quality between the two or more transmit antennas and the base station transceiver. The controller can be implemented as may any means for controlling, a controller unit, a controller device, a controller module, etc. The controller may even be implemented as software being executed on an accordingly adapted hardware, such as any processor, a DSP, an ASIC, etc.

The information related to the radio link quality between the two or more transmit antennas and the base station transceiver can, for example, be in terms of a Signal-to-Noise-Ratio (SNR), a Signal-to-Interference-and-Noise-Ratio (SINR), a Signal-to-Interference-Ratio (SIR), a Received Signal Code Power (RSCP), a Received Signal Strength Indicator (RSSI), a Bit Error Rate (BER), a block error rate, a frame error rate, a path loss, etc. Any information on a measure that would allow indicating the quality of the radio link between the two or more transmit antennas and the base station transceiver may be used. Such information may as well be determined by another entity, such as the central unit. The information related to the radio link quality may then correspond to an indication or information from said other entity. There may be separate quality measures for the links between all the individual aircraft/train antennas and the antennas of one serving (receiving) base station transceiver.

The controller can be further operable to control the switch based on the information related to the radio link quality. In other words, the remote radio head apparatus may comprise a controller for determining or evaluating a radio link quality from each of the transmit antennas to the respective ground base station. Which one of the at least two transmit antennas is to be used may then be decided based on said radio link quality evaluation. Embodiments may therewith provide the advantage that a transmit antenna providing a better radio link quality for the communication to the ground base station can be selected, while the other transmit antenna can be switched off. At the same time, no hardware resources are wasted since only a single remote radio head is used.

In further embodiments the controller can be operable to switch off a transmit antenna from the two or more transmit antennas for which a lowest radio link quality is indicated by the information related to the radio link quality. In other words, in embodiments the radio link with the better quality, i.e. the transmit antenna with the better quality, may be used, while the one with the lower quality is switched off.

In further embodiments, the two or more transmit antennas may correspond to transmit and receive antennas. In other words, some antennas may be used as transmit and receive antennas. In embodiments there may be further antennas, which can be used solely as transmit or receive antennas. Moreover, in embodiments, the number of receive antennas and the number of transmit antennas may be different. For example, more receive antennas may be used than transmit antennas or vice-versa. The controller can be operable to determine the information related to the radio link quality based on radio signals received by the two or more transmit and receive antennas from the base station transceiver. That is to say, the controller can be operable to determine the receive quality of receive signals from the respective base station transceiver. Based on the received quality, and with the given radio channel, it may be concluded that at least long term fading statistics in the other direction, i.e. when transmitting from the remote radio head to the base station transceivers, are similar.

Therefore, in some embodiments, the controller can be operable, to determine the information on the radio link quality from receive signals, and then select the receive antenna with the highest radio quality of the receive signal as transmit antenna. In further embodiments, other concepts are conceivable. For example, reference signals may be transmitted from each of the transmit antennas at different times. The base station transceiver may then receive the reference signals, determine a channel quality measure based on the reference signals, and report channel quality information back to the remote radio head, in order to inform the remote radio head which one of the transmit antennas provides for a better quality. It is to be noted that in the scenario using airplane-to-ground communication, the fading statistics, especially the fast fading statistics due to the strong LOS-path are different from the ground-to-ground statistics. For example, the fast fading may not follow a Rayleigh distribution as known from ground measurement campaigns, but rather a Rise-distribution, due to the strong LOS-paths. Therewith, fast fading on the signal may not be as severe as it is in ground communication. The variations in the channel may not be as fast as they are on the ground. Therefore, feedback loops may not have to be as fast or as frequent as for ground communication.

In further embodiments the remote radio head apparatus may further comprise one or more duplexer filters to separate transmission and reception paths of the one or more transmit and receive antennas, providing the advantage that the same antennas may be used for reception and transmission. Moreover, in further embodiments, the remote radio head apparatus may further comprise an interface which is operable to communicate an optical signal with a central unit. As it has already been mentioned above, the remote radio head together with the central unit may constitute a sort of relay station relaying information received from the base station transceiver to the inside of, for example, an aircraft and vice-versa. Since installation requirements may demand that the remote radio unit is as close as possible to the transmit antennas while the central unit has to be installed at another strategic point, they may be spatially separated. In order to still be connected, both components may have interfaces which allow communication of the respective information. In some embodiments, such interface may be realized using an optical interface such that the two components can be connected by optical fibers. In other embodiments, electrical signals may be used to exchange the information between these two components. In yet other embodiments it is even conceivable that another wireless connection is used between the central unit and the remote radio head.

In further embodiments the remote radio head apparatus may further comprise a Digital/Analog Converter (DAC) for converting a digital signal received from a central unit into an analog signal for subsequent radio transmission using at least one out of the two or more transmit antennas. That is to say, in some embodiments the digital path or the digital signal processing may be located in the central unit while the remote radio head converts the signals from the digital domain to an analog domain in order to transmit an analog radio signal to the base station transceiver. It is to be noted that in the opposite direction, when receiving signals from the base station receiver and relaying said signals to the inside of an airplane, for example, the remote radio head apparatus may as well comprise an Analog/Digital Converter (ADC), in order to convert received radio signals from an analog domain to a digital domain and then provide the digital signal to the central unit. Such embodiments may provide the advantage that digital signals can be exchanged between the remote radio head and the central unit. Therefore, the signal quality may be higher as there are no or reduced losses, noise or disturbances to expect on the interface or on the communication path between these two components. The transmission of the digital signals between the central unit and the remote radio head can be adapted to the respective transmission path or transmission channels between these two and according error protection means can be used.

Embodiments further provide onboard equipment for an airplane, which comprises a remote unit or a remote radio head with an apparatus according to the above description and an according central unit. In further embodiments, the onboard equipment may comprise a central unit, which corresponds to an air-to-ground communication modem and wherein the two or more transmit antennas correspond to outside fuselage antennas, i.e. antennas mounted at the body or at the belly of the airplane. For example, there may be two transmit antennas, one mounted in front of the wings and the other one mounted behind the wings of the airplane.

The onboard equipment may comprise an in-cabin transceiver for communicating radio signals with mobile transceivers in a cabin of an airplane. In embodiments, the in-cabin transceiver may correspond to a transceiver complying with any one of the above-listed communication systems. Embodiments may then allow passengers of the airplane to use their mobile receivers, such as cell phones, laptop computers, etc. to communicate with the central unit of the onboard equipment. The central unit or the air-to-ground communication modem may then be connected with the remote radio head which in turn provides the radio link to the ground base station. Therewith, a passenger may experience connectivity in the plane which is close to the ground experience.

In further embodiments, the remote unit or remote radio head may be the only remote radio head of the onboard equipment. That is to say, that in some embodiments a single remote radio head may be used comprising the switch allowing to switch between the two or more transmit antennas and providing the above described advantages.

Embodiments further provide a method for a remote radio head. The remote radio head is operable to communicate information with the central unit and the remote radio head is operable to transmit a transmit signal to a base station transceiver of a mobile communication system using two or more transmit antennas. The method comprises switching a transmit signal between the two or more transmit antennas.

Embodiments further provide a computer program having a program code for performing one of the above methods, when a computer program is executed on a computer, processor or programmable hardware.

Embodiments may provide the advantage that one remote radio head may be used with multiple transmit antennas, while a switch allows to switch the transmit signal between these antennas. Therefore, further remote radio heads or radio frequency components can be saved. The remote radio unit or an overall system comprising the remote radio unit can be more cost efficient and more lightweight, while still being able to use more than one transmit antenna to select from.

BRIEF DESCRIPTION OF THE FIGURES

Some other features or aspects will be described using the following non-limiting embodiments of apparatuses and/or methods and/or computer programs by way of example only, and with reference to the accompanying figures, in which

FIG. 7 illustrates a block diagram of an embodiment of a method for a remote radio head.

DESCRIPTION OF SOME EMBODIMENTS

Various embodiments will now be described in more detail with reference to the accompanying drawings. In the Figures, the thicknesses of lines, layers and/or regions may be exaggerated for clarity.

Accordingly, while embodiments are capable of various modifications and alternative forms, embodiments thereof are shown by way of example in the Figures and will herein be described in detail. It should be understood, however, that there is no intent to limit embodiments to the particular forms disclosed, but on the contrary, embodiments are to cover all modifications, equivalents, and alternatives falling within the scope of the invention. Like numbers refer to like or similar elements throughout the description of the Figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the following description some components will be displayed in multiple Figures carrying the same reference signs, but may not be described multiple times in detail. A detailed description of a component may then apply to that component for all its occurrences.

Figure 1:
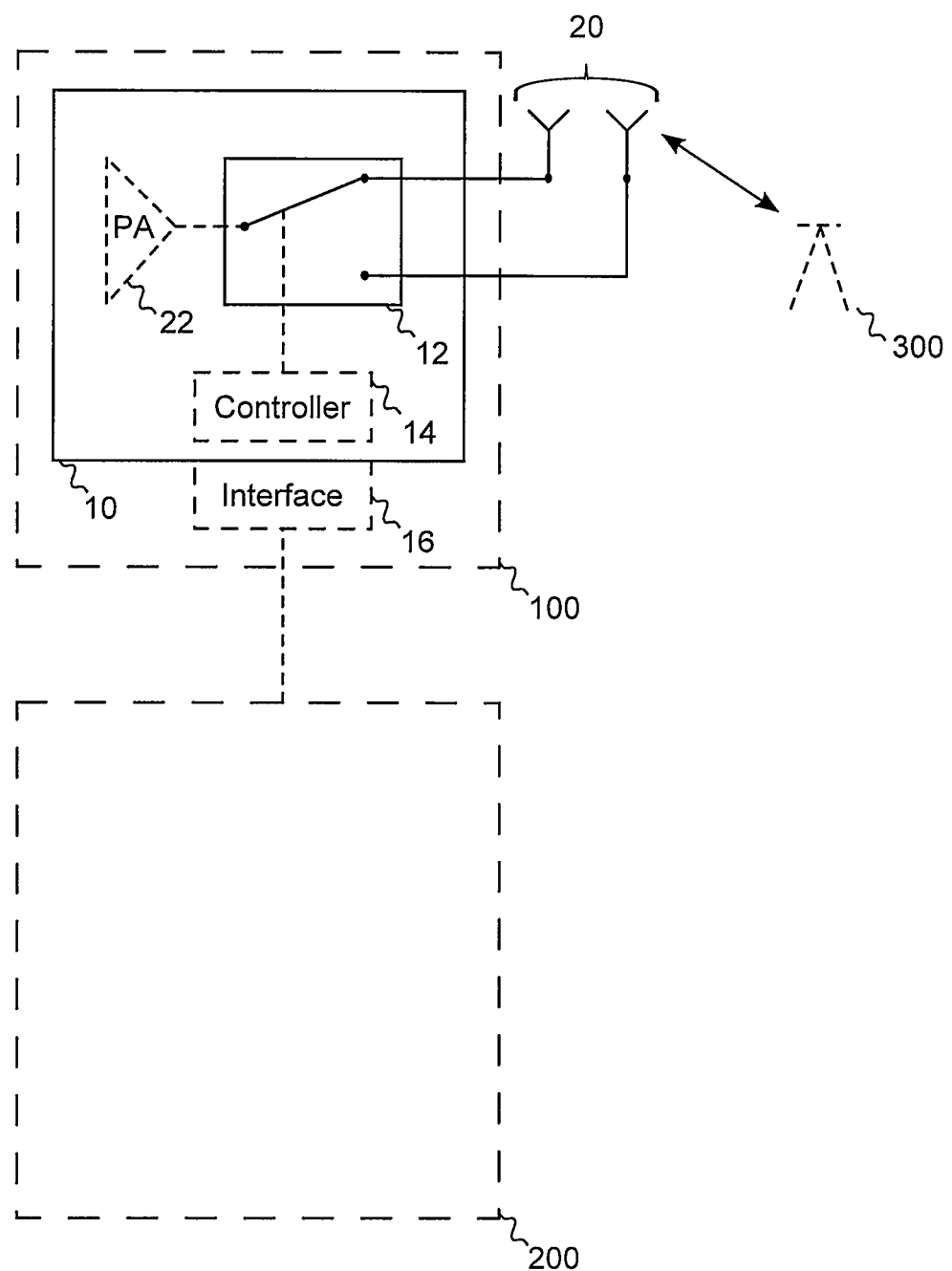
FIG. 1 illustrates an embodiment of a remote radio head apparatus.

In the following Figures optional components are shown in dashed lines. FIG. 1 shows an embodiment of an apparatus 10 for a remote radio head 100. The remote radio head 100 is operable to communicate information with a central unit 200. The remote radio head 100 is further operable to transmit a transmit signal to a base station transceiver 300 of a mobile communication system using two or more transmit antennas 20. The remote radio head apparatus 10 comprises a switch 12 which is operable to switch the transmit signal between the two or more transmit antennas 20. In the embodiment shown in FIG. 1 the remote radio head apparatus 10 further comprises a power amplifier 22 for amplifying the transmit signal. The switch 12 is operable to switch the amplified transmit signal between the two or more transmit antennas 20.

In the embodiment shown in FIG. 1 the switch 12 is operable to switch at least one of the at least two transmit antennas substantially off. The term substantially indicates here that a significant part of the transmit power is directed to one antenna where on the other antenna there may only be some crosstalk or background noise or other insignificant signal parts of the transmit signal. The remote radio head 100 and the central unit 200 can be operable in an airplane or a train and the base station transceiver 300 can correspond to a ground base station transceiver, for example, as part of an LTE communication network.

As FIG. 1 indicates, the remote radio head apparatus 10 further comprises a controller 14 operable to determine information related to a radio link quality between the two or more transmit antennas 20 and the base station transceiver 300. The controller 14 is further operable to control the switch 12 based on the information related to the radio link quality. Moreover, the controller 14 is operable to switch off a transmit antenna from the two or more transmit antennas 20 for which a lowest radio link quality is indicated by the information related to the radio link quality. In embodiments, the two or more transmit antennas 20 may correspond to transmit and receive antennas. The controller 14 can be operable to determine the information related to the radio link quality based on radio signals received by the two or more transmit and receive antennas from the base station transceiver 300, for example, from the ground network represented in FIG. 1 by the base station transceiver 300. As stated above, in some embodiments the decision on which antenna to be used may be made at another entity, such as a DA2G modem, communicated to the RRH apparatus 10 and the controller 14 comprised by the RRH apparatus 10 may simply execute the decisions by controlling the switch 12. Determining the information related to the radio link quality may then correspond to receiving information related to said decision, e.g. in terms of one or more bits or indicators.

Figure 2:
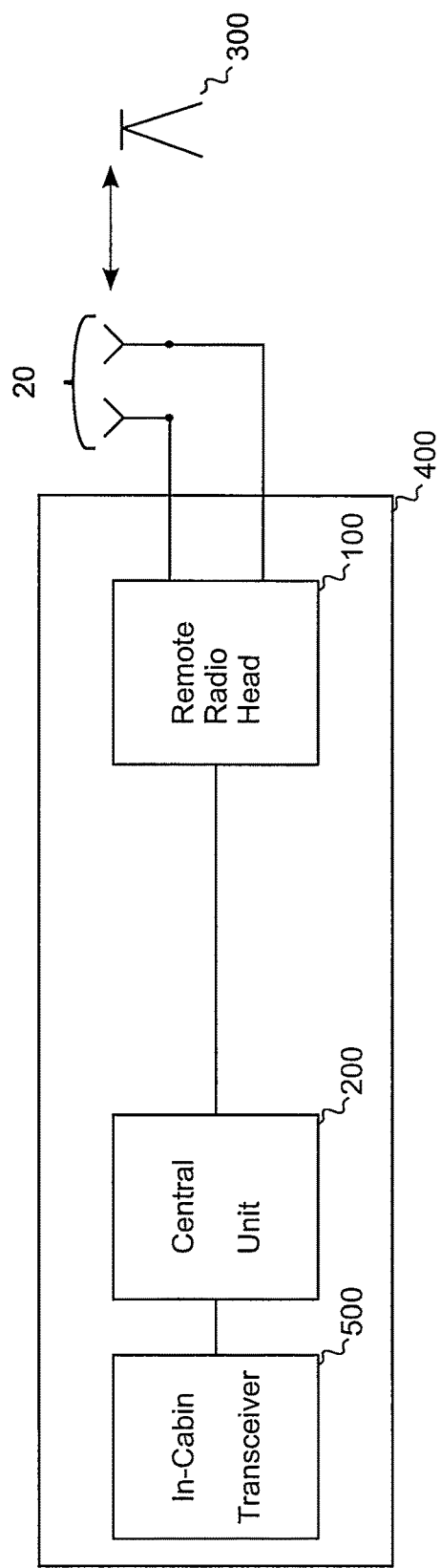
FIG. 2 illustrates an embodiment of onboard equipment.

As shown in FIG. 1, in the embodiment the remote radio head apparatus 10 optionally comprises an interface 16 which is operable to communicate optical signals with the central unit 200. FIG. 2 illustrates an embodiment of onboard equipment 400 for an airplane. The onboard equipment 400 comprises a remote radio head 100, in line with the embodiment depicted in FIG. 1. Hence, the remote radio head 100 comprises the remote radio head apparatus 10 as described with the help of FIG. 1. As shown in FIG. 2 the onboard equipment 400 further comprises a central unit 200. In the embodiment shown in FIG. 2, the central unit 200 may correspond to an air-to-ground communication modem and the two or more transmit antennas 20 may correspond to fuselage antennas. It is further assumed that there are at least two transmit antennas 20, one of which is mounted in front of the wings of the airplane and the other one is mounted behind the wings of the airplane.

As shown in FIG. 2, the onboard equipment 400 further comprises an in-cabin transceiver 500 for communicating radio signals with mobile transceivers in a cabin of the airplane. In the present embodiment it can be assumed that the in-cabin transceiver 500 provides GSM or Wi-Fi compliant access inside the cabin. Such technology may already be available for aircraft use and it may distinguish between the link in the cabin, which may use any technology in other embodiments, and the LTE link of the DA2G network to the ground in the present embodiment. In other embodiments, another LTE standard compliant network in the cabin of the airplane can be assumed such that passengers may use their mobile phones or devices to communicate with the central unit 200 via the in-cabin transceiver 500 in an LTE compliant way. Similar considerations would apply for a cabin of a train. Moreover, it is assumed that in the present embodiment the remote radio head 100 is the only remote radio head used to communicate with the base station transceiver 300.

Figure 3:
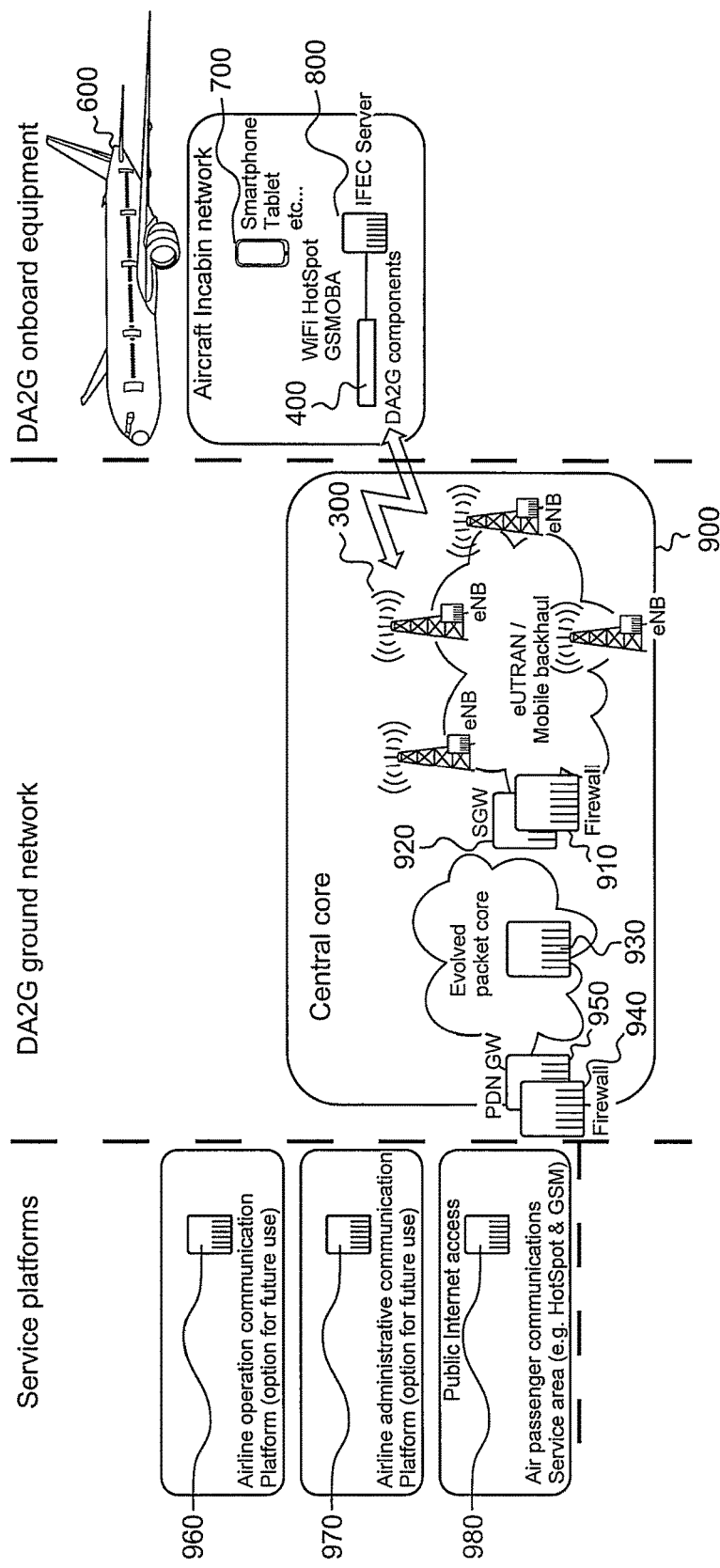
FIG. 3 illustrates direct air-to-ground communication in an end-to-end network.

FIG. 3 shows an overview of a Direct Air-to-Ground (DA2G) end-to-end network. On the right-hand side FIG. 3 shows an airplane 600 in which an onboard equipment 400 is installed. As shown on the right-hand side of FIG. 3 the airplane 600 may further comprise mobile phones 700, as for example brought by according passengers of the plane 600. Moreover, there may be on-plane components such as an Inflight Entertainment and Connectivity (IFEC) server 800. As indicated in FIG. 3 the onboard equipment 400 communicates with a base station 300, which is part of a DA2G ground network 900. The mobile communication network 900 is implemented as an LTE network comprising ground base stations, i.e. ground eNodeBs (eNB). The eNodeBs are interconnected by the eUTRAN/mobile backhaul which, is separated by a firewall 910 or a Serving GateWay (SGW) 920 from the Evolved Packet Core 930 (EPC). The EPC 930 is then separated by another firewall 940 or another Packet Data Network GateWay (PDN GW) 950 from respective service platforms.

In FIG. 3 the service platforms may correspond to an airline operation communication platform 960 which may be another option for future use. Another service platform is the airline administrative communication platform 970 which is another option for future use. Yet another platform is the public internet access 980 which corresponds to the air passenger communication service area, such as hotspot services or GSM services. FIG. 3 illustrates the end-to-end direct air-to-ground network concept with a ground network of LTE-based base station and aircraft equipped with OnBoard Equipment (OBE). The onboard equipment 400 comprises the DA2G modem function, as an implementation for the central unit 200, to set up a wireless data link between the aircraft 600 and the ground, i.e. the ground base station or eNB 300. Moreover, the OBE may enable wireless services inside the airplane such GSM OnBoard Aircraft (GSMOBA), WIFI HotSpot, etc.

Figure 4:
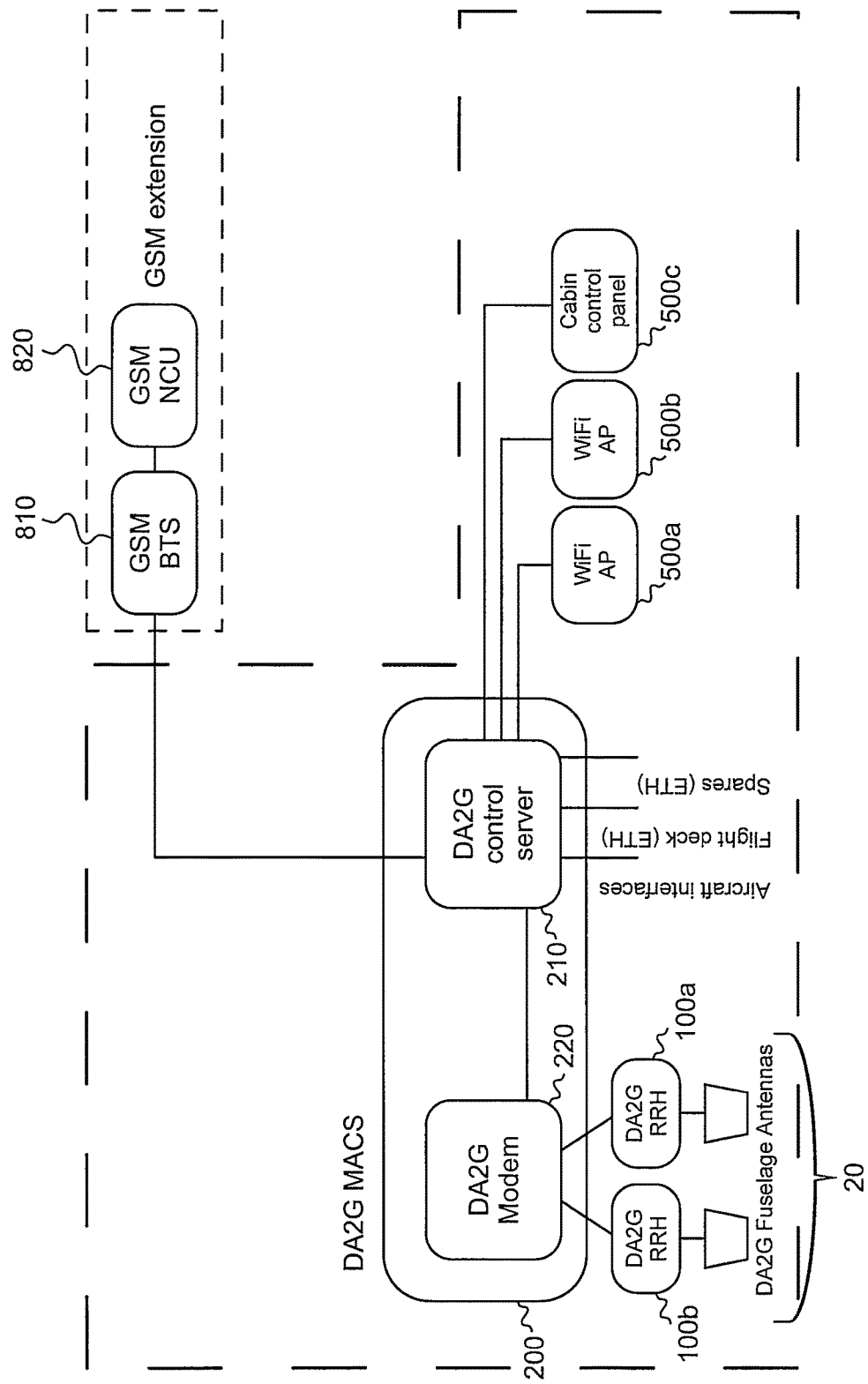
FIG. 4 illustrates onboard equipment architecture.

FIG. 4 illustrates an overview of onboard equipment architecture with some simplifications. The architecture shown in FIG. 4 shows two transmit antennas 20 on the left-hand side, which are coupled to two remote radio heads 100a and 100b, which are coupled to a central unit 200, which is implemented as a DA2G Modem And Control Server (MACS). The DA2G MACS, as an implementation of the central unit 200, comprises the DA2G modem 220, which is further coupled to the DA2G control server 210.

Figure 5:
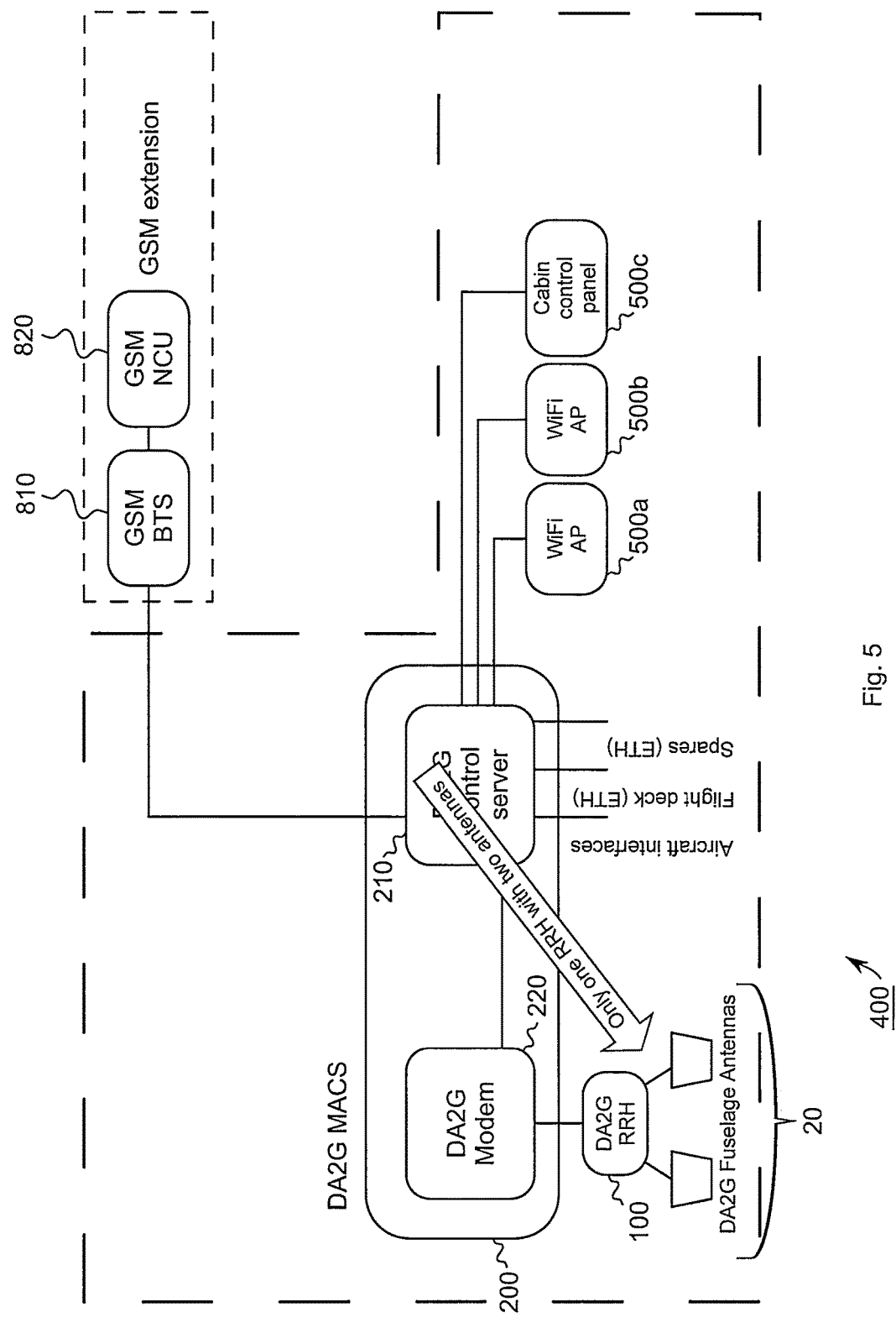
FIG. 5 illustrates onboard equipment architecture in an embodiment.

The central unit 200 comprises a DA2G modem 220, which connects to a DA2G control server 210. The DA2G control server 210 may have further aircraft interfaces, which can be implemented as ETHernet (ETH) interfaces, for example, to the flight deck or spare interfaces. As shown in FIG. 4, the DA2G control server 210 is further coupled with WIFI applications 500a and 500b as well as to a cabin-control panel 500c, which are implementations of in-cabin transceivers 500. Moreover, the DA2G control server 210 is coupled to a GSM Base Transceiver Station (GSM BTS) and a GSM Network Control Unit (GSM NCU) 820 in order to implement a GSM extension to allow mobile transceivers onboard the airplane to use GSM services such as voice telephony. FIG. 4 shows architecture of DA2G onboard equipment. The relevant parts for communications with the ground network are the DA2G modem 220, the two DA2G remote radio heads 100a, 100b, and the two DA2G fuselage antennas 20. For example, the system can be operated in a Frequency Division Duplex (FDD) mode. FIG. 5 illustrates another embodiment of onboard equipment 400. The embodiment comprises similar components as shown in the architecture of FIG. 4, except that there is only a single remote radio head 100, which is coupled the two or more transmit antennas 20, which are again implemented as DA2G fuselage antennas. The system with the embodiment may therefore weigh less and consume less power than the system with two remote radio heads as depicted in FIG. 4. As indicated in FIG. 5, there is only one remote radio head with two antennas in the present embodiment. Each DA2G fuselage antenna houses two antenna elements. For example, both of these antenna elements are used for reception (RX) in the ground-to-air wireless link, and one of these antenna elements is also used for transmission (TX) in the air-to-ground link. Two RX elements are may be used to support Multiple-Input-Multiple-Out (MIMO) reception.

In order to avoid losses from cabling inside the aircraft and in order to increase the mounting flexibility of the various system components inside the aircraft 600, the architecture comprises a DA2G remote radio head which is connected using optical fiber links to the DA2G modem 220 and very short coaxial cables to the DA2G fuselage antennas 20. The DA2G remote radio head contains the DA2G Radio Frequency (RF) functions of the OBE separated from the DA2G digital functions located at the DA2G modem 220. By this approach, the DA2G fuselage antennas 20 and the DA2G remote radio head 100 can be almost placed independently from the DA2G modem 220 at mounting positions most favorable for the wireless communication on the ground.

Embodiments may therewith overcome the drawback that two DA2G remote radio heads 100a and 100b, cf. FIG. 4, are used for interfacing to the two DA2G fuselage antennas 20. Usage of two DA2G remote radio heads leads to higher costs for the equipment, installation and operation of the onboard equipment.

As it has already been mentioned above, it is considered to be favorable to use only one DA2G remote radio head 100, cf. FIG. 5, instead of two DA2G remote radio heads 100a, 100b, cf. FIG. 4, for interfacing to two DA2G fuselage antennas 20. Embodiments may therewith save costs for the equipment, installation and operation of the onboard equipment. FIG. 5 shows an overview of an embodiment of the onboard equipment architecture with only one DA2G remote radio head 100 connecting to two DA2G fuselage antennas 20 by coaxial cables and to the DA2G modem 220 by an optical fiber link.

Figure 6:
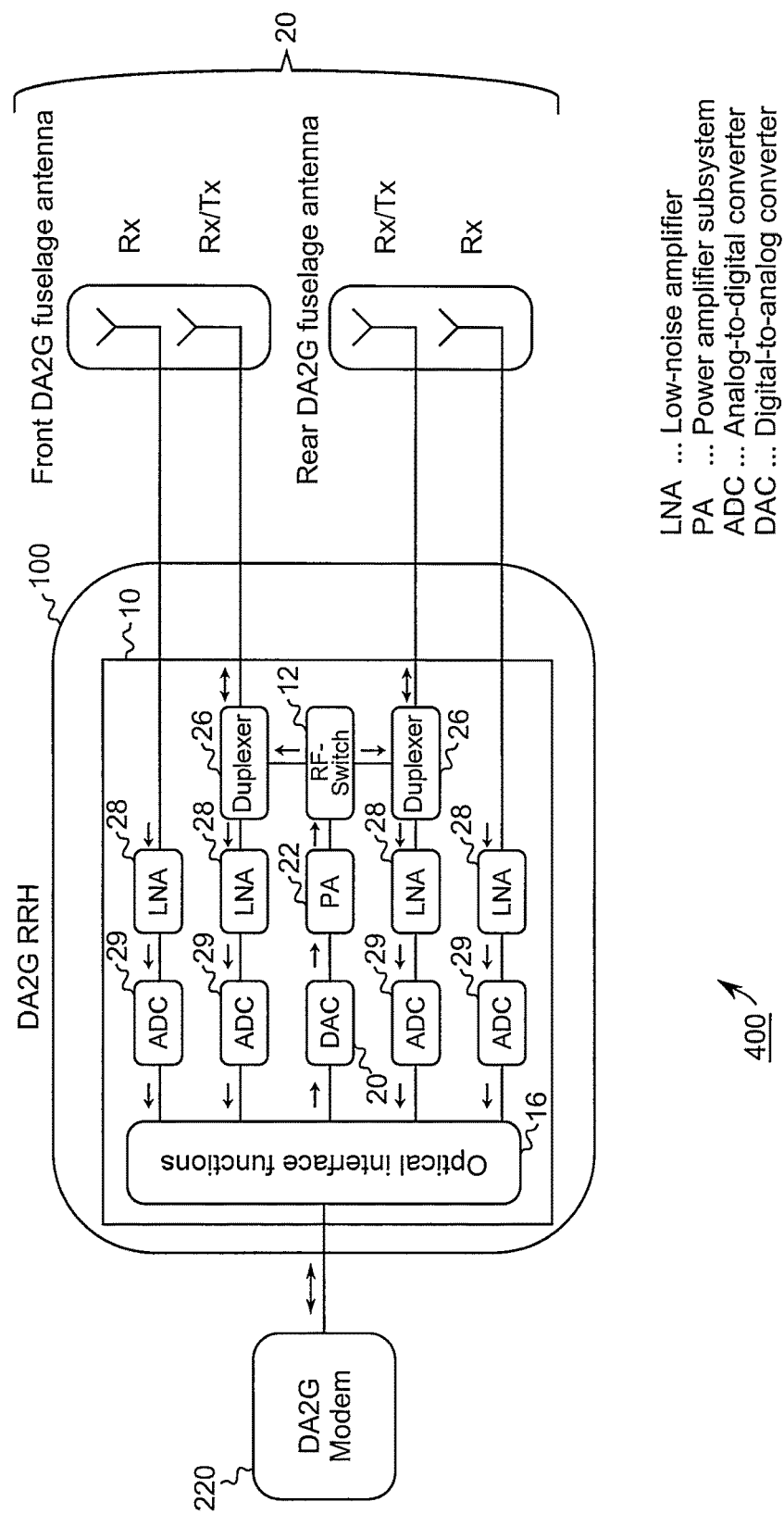
FIG. 6 illustrates an embodiment of onboard equipment with an embodiment of a remote radio head.

FIG. 6 illustrates another embodiment of onboard equipment 400. FIG. 6 shows on the left-hand side a DA2G modem 220, as part of a central unit 200, which is not shown in FIG. 6 to keep a better overview. The DA2G modem 220 is coupled to a DA2G remote radio head 100, of which further details will be explained subsequently. As can be seen from FIG. 6, the DA2G remote radio head 100 is coupled to four antennas 20, of which the two shown in FIG. 6 at the top are front DA2G fuselage antennas (in front of the wings) and the two shown at the bottom of FIG. 6 are rear DA2G fuselage antennas (behind the wings). In the reception path, all four antennas 20 are used, while in the transmission path, only one transmission antenna from the front or the rear antenna pair is used. This is indicated in FIG. 6 by the respective RX and RX/TX labels. Hence, there are two antennas with two antenna elements each, where one antenna element is a reception only antenna element and the other one is a combined reception and transmission antenna element. As shown in FIG. 6, there is only one Power Amplifier (PA) 22 in the transmission path. The PA 22 is followed by the RF switch 12 which is capable of switching the transmit or the amplified transmit signal between the two transmission paths leading to the front transmit antenna and the rear transmit antenna, respectively. As shown in FIG. 6, there is only one transmit data stream from the modem 220. The RF switch 12 is used to select one of the transmit antennas, i.e. either the front or the rear transmit antenna.

As FIG. 6 further shows an optical interface 16 is used to communicate with the DA2G modem 220. As shown in FIG. 6, the remote radio head apparatus 10 further comprises duplex filters 26 to separate transmission and reception paths of the one or more transmit and receive antennas 20. In other words, the two antennas which are used for reception and transmission, are coupled to their individual duplexers 26. The duplexers 26 transfer signals only in certain directions, therewith separating transmission and reception paths. As further shown in FIG. 6 in the four reception paths there are four Low-Noise Amplifiers (LNA) 28 followed by corresponding Analog-to-Digital Converts (ADC) 29 implementing the receiving path. In the embodiment shown in FIG. 6 the remote radio head apparatus 10 further comprises a Digital-to-Analog Converter (DAC) 20 for converting a digital signal received from the central unit 200, i.e. the DA2G modem 220, into an analog signal for subsequent radio transmission using at least one out of the two or more transmit antennas 20. As shown in FIG. 6, the RF switch 12 can switch the amplified transmit signal, which is the digital-to-analog converted digital signal from the DA2G modem 220 between the two duplexers 26, i.e. between the front or the rear transmit antenna.

FIG. 6 illustrates the detailed architecture of the DA2G remote radio head 100 that connects the DA2G fuselage antennas 20 over connection cables and to the DA2G modem 220 over an optical fiber link. As can be seen from FIG. 6 all four antenna elements are used for reception. Proper combining of the receive signals, as for example maximum-ratio-combining, is performed in the DA2G modem 220 in the digital domain. Thus, four LNAs 28 and four ADCs 29 are used to determine the four receive signals for subsequent combination.

In the embodiment shown in FIG. 6, one of two antenna elements is used for transmission. As the system supports transmission of one data stream over one antenna, only a single power amplifier subsystem 22 is used. The output signal can be switched to either one of the two DA2G fuselage antennas by means of the RF-switch 12. After the RF-switch 12, the transmit signal is provided to the duplexer filter 26 for the selected antenna element.

The selection of the transmit antenna element is based on an algorithm either executed inside the DA2G modem 220 or inside the DA2G remote radio head 100 itself. Hence, in line with the embodiment as described in FIG. 6, the algorithm may be executed in the controller 14. In other embodiments, the controller 14 may receive said information from the central unit 200, the DA2G modem 220 respectively. The algorithm may evaluate the receive signals on all four antennas and may determine the DA2G fuselage antenna that has the better propagation condition to the ground base station 300, i.e. the one which is less affected by any shadowing effect.

In some embodiments, the information related to a radio link quality between the two or more transmit antennas and the base station transceiver can correspond to one bit, for example indicating, which one out of two transmit antennas is the one that has the better link quality. In other words, in some embodiments, the information related to the radio link quality may be determined externally to the remote radio head apparatus. For example, such information may be determined and evaluated in the central unit 200, which then provides an information related to the radio link quality, which in some embodiments may correspond to an indicator or a single bit, to the controller 14, which can then react or switch accordingly.

The interface 16 realizes optical interface functions to multiplex the digitalized receive signals, potentially together with control information, and provide them to the DA2G modem 220. The optical interface function 16 receives the digital transmit signal from the DA2G modem 220, again potentially together with control information, and feeds this signal to the power amplifier 22. All other signals and information exchange between the DA2G remote radio head 100 and the DA2G modem 220 can also be handled by the optical interface functions.

Figure 7:
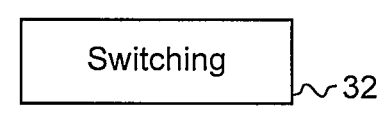

FIG. 7 illustrates a block diagram of an embodiment of a method for a remote radio head 100. The remote radio head 100 is operable to communicate information with a central unit 200 and the remote radio head 100 is operable to transmit a transmit signal to a base station transceiver 300 of a mobile communication system using two or more transmit antennas 20. The method comprises switching 32 the transmit signal between the two or more transmit antennas 20.

Embodiments further provide a computer program having a program code for performing one of the above methods, when the computer program is executed on a computer, processor or programmable hardware.

Embodiments provide the advantage that hardware, for example a remote radio head, can be reused for multiple transmit antennas. Embodiments may therewith allow cost-effective onboard equipment architecture for a DA2G communication system. In some embodiments, only one DA2G remote radio head needs to be installed per aircraft. This may save a significant amount of weight and money, and may also reduce power consumption. Therewith, the CAPital EXpenditure (CAPEX) as well as the OPerational EXpenditure (OPEX) may benefit from embodiments. Installation of only one DA2G remote radio head instead of two units may reduce the installation time and it may avoid additional aircraft-on-ground time during which the airline would lose revenues.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as magnetic disks and magnetic tapes, hard drives, or optically readable digital data storage media. The embodiments are also intended to cover computers programmed to perform said steps of the above-described methods or (field) programmable logic arrays ((F)PLAs) or (field) programmable gate arrays ((F)PGAs), programmed to perform said steps of the above-described methods.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing or to perform a certain function, respectively. Hence, a "means for s.th." may as well be understood as a "means being adapted or suited for s.th.". A means being adapted for performing a certain function does, hence, not imply that such means necessarily is performing said function (at a given time instant).

The functions of the various elements shown in the Figures, including any functional blocks labeled as "means", "means for interfacing", "means for switching", "means for controlling", "means for processing", etc., may be provided through the use of dedicated hardware, such as "an interface", "a switch", "a controller", "a processor", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The invention claimed is:

1. An apparatus for a remote radio head, the remote radio head communicating information with a central unit and transmitting a transmit signal to a base station transceiver of a mobile communication system using two or more transmit antennas, wherein the apparatus comprises:
   a power amplifier for amplifying the transmit signal; and
   a switch that selectively switches the amplified transmit signal between the two or more transmit antennas such that the amplified transmit signal is transmitted from that transmit antenna to which the amplified transmit signal is switched.

2. The apparatus of claim 1, wherein the switch switches at least one of the at least two transmit antennas off.

3. The apparatus of claim 1, wherein the remote radio head and the central unit are located in an airplane and wherein the base station transceiver corresponds to a ground base station transceiver.

4. The apparatus of claim 1, further comprising a controller that determines information related to a radio link quality between the two or more transmit antennas and the base station transceiver and wherein the controller further controls the switch based on the information related to the radio link quality.

5. The apparatus of claim 4, wherein the controller switches off a transmit antenna from the two or more transmit antennas for which a lowest radio link quality is indicated by the information related to the radio link quality.

6. The apparatus of claim 4, wherein the two or more transmit antennas correspond to transmit and receive antennas, and wherein the controller determines the information related to the radio link quality based on radio signals received by the two or more transmit and receive antennas from the base station transceiver.

7. The apparatus of claim 6, further comprising one or more duplexer filters to separate transmission and reception paths of the one or more transmit and receive antennas.

8. The apparatus of claim 1, further comprising an interface that communicates optical signals with the central unit.

9. The apparatus of claim 1, further comprising a digital/analog converter for converting a digital signal received from the central unit into an analog signal for subsequent radio transmission using at least one of the two or more transmit antennas.

10. Onboard equipment for an airplane, comprising a remote radio head with an apparatus according to claim 1 and a central unit.

11. The onboard equipment of claim 10, wherein the central unit corresponds to an air-to-ground communication modem and wherein the two or more transmit antennas correspond to fuselage antennas.

12. The onboard equipment of claim 10, further comprising an in-cabin transceiver for communicating radio signals with mobile transceivers in a cabin of an airplane.

13. The onboard equipment of claim 10, wherein the remote radio head is the only remote radio head.

14. A method for a remote radio head, the remote radio head communicating information with a central unit and the remote radio head transmitting a transmit signal to a base station transceiver of a mobile communication system using two or more transmit antennas, the method comprising:
   amplifying the transmit signal; and
   switching the amplified transmit signal between the two or more transmit antennas such that the amplified transmit signal is transmitted from that transmit antenna to which the amplified transmit signal is switched.

15. A non-transitory computer readable medium having thereon a program code for performing the method of claim 14, when the program code is executed on a computer, processor or programmable hardware.

* * * * *